(12) United States Patent  
Braude et al.

(10) Patent No.: US 8,207,504 B2  
(45) Date of Patent: Jun. 26, 2012

(54) INSPECTION OF EUV MASKS BY A DUV MASK INSPECTION TOOL

(75) Inventors: Chaim Braude, Nes-Ziona (IL); Mariano Abramson, Jerusalem (IL); Adam Baer, Kfar Urivah (IL); Jimmy Vishnipolsky, Petah Tikva (IL); Yuri Belenky, Rishon LeZiyyon (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 12/950,058

(22) Filed: Nov. 19, 2010

(65) Prior Publication Data

US 2011/0121193 A1 May 26, 2011

Related U.S. Application Data

(60) Provisional application No. 61/262,866, filed on Nov. 19, 2009.

(51) Int. Cl.  
*G01J 1/42* (2006.01)
(52) U.S. Cl. .................................................... 250/372
(58) Field of Classification Search .................. 250/372, 250/491.1  
See application file for complete search history.

(56) References Cited

U.S. PATENT DOCUMENTS

| | | | |
|---|---|---|---|
| 6,239,863 B1 | 5/2001 | Catey et al. | |
| 6,364,595 B1 | 4/2002 | Bonora et al. | |
| 6,492,067 B1 | 12/2002 | Klebanoff et al. | |
| 6,646,720 B2 | 11/2003 | Ramamoorthy et al. | |
| 6,720,118 B2 * | 4/2004 | Yan et al. ........................ | 430/5 |
| 6,734,445 B2 | 5/2004 | Ramamoorthy et al. | |
| 6,906,783 B2 | 6/2005 | del Puerto et al. | |
| 6,912,043 B2 | 6/2005 | Galburt | |
| 7,042,554 B2 | 5/2006 | Galburt | |
| 7,209,220 B2 | 4/2007 | Puerto et al. | |
| 7,304,720 B2 | 12/2007 | del Puerto et al. | |
| 7,413,586 B2 | 8/2008 | Ramamoorthy et al. | |
| 7,453,549 B2 | 11/2008 | Suzuki et al. | |
| 7,477,358 B2 | 1/2009 | Phillips et al. | |
| 2010/0079738 A1* | 4/2010 | Eisenmenger et al. ......... | 355/67 |

OTHER PUBLICATIONS

Pettibone et al., "Optical Inspection of EUV and SCALPEL reticles," 2001, Proceedings of SPIE, vol. 4409, pp. 710-717.*  
Liang et al., "Pattern Inspection of EUV masks using DUV light," 2002, Proceedings of SPIE, vol. 4889, pp. 1065-1072.*  
Yook et al., "Evaluation of protection schemes for extreme UV lithography (EUVL) masks against top-down aerosol flow," 2007, Aerosol Science, vol. 38, pp. 211-227.*  
P. J. Silverman, "Extreme ultraviolet lithography: overview and development status," 2005, Journal of Microlithography, Microfabrication, and Microsystem, vol. 4, No. 1, pp. 011006-1 to 011006-5.*

* cited by examiner

*Primary Examiner* — Kiho Kim  
(74) *Attorney, Agent, or Firm* — Tarek N. Fahmi, APC

(57) ABSTRACT

A system that includes: (a) a mask manipulator, that is arranged to: receive an opaque EUV pod that encloses an EUV mask, extract, in a highly clean environment, the EUV mask from the outer pod and the inner pod of the EUV pod, and cover an upper face of the EUV mask with protective cover that is at least partially transparent to DUV radiation; (b) a scanner, arranged to scan the EUV mask, using DUV illumination while maintaining in the scanner an environment that has a cleanliness level that is below a tolerable EUV mask cleanliness level; and (c) a transport system arranged to transport the EUV mask and the protective cover between the scanner and the mask manipulator.

19 Claims, 12 Drawing Sheets

Receiving, by an external pod manipulator, an EUV pod that encloses a EUV mask. The EUV pod includes an inner pod that may be placed inside an outer pod. The EUV pod may be substantially opaque DUV radiation so that the EUV mask can not be inspected by a DUV inspection system without extracting it from the EUV pod or at least removing the cover of the inner pod and, additionally or alternatively, the cover of the external pod. 910

↓

Extracting, in a highly clean environment, the EUV mask from the outer pod and the inner pod. 920

↓

Enclosing, in the highly clean environment, the EUV mask by a protective pod that may be at least partially transparent to DUV radiation thereby allowing the EUV mask to be scanned by DUV radiation while being maintained in a cleanliness level that may be below a tolerable EUV mask cleanliness level. 930

↓

Providing the EUV mask and the protective pod to an inspection tool. 940

↓

Receiving the protective pod by a mask inspection tool and providing the protective pod to a scanner of the inspection tool. 950

↓

Inspecting the EUV mask by scanning the EUV mask, using the DUV illumination and collecting DUV radiation resulting from the scanning. 750

↓

Providing the EUV mask and the protective pod to the external pod manipulator. 960

↓

Removing, in the highly clean environment, the protective pod from the EUV mask and placing (in the highly clean environment) the EUV mask in the EUV pod. 970

INSPECTION OF EUV MASKS BY A DUV MASK INSPECTION TOOL

RELATED APPLICATIONS

This application is a NONPROVISIONAL of and claims priority to U.S. provisional patent application No. 61/262,866, filed Nov. 19, 2009, which is incorporated herein by reference.

BACKGROUND

Lithography for semiconductor manufacturing is constantly changing to shorter wavelengths in order to meet the need to print smaller features. Currently the industry is about to begin the transition from the current DUV (Deep Ultra Violet, i.e., 193 nm) lithography that provides its high-end manufacturing capability to EUV radiation (Extreme UV, i.e., 13.4 nm). The development of special EUV masks (reticles) for EUV lithography is now at final research and development stages.

Among other challenges, the following modifications in the design of the EUV masks are considered and implemented:

A. Different from transparent DUV masks, EUV masks have a metallic layer on the back side. The upper side of the EUV mask is reflective and during the lithographic process this upper side is illuminated by EUV radiation.

B. Different from DUV masks, EUV masks have no pellicle protective cover.

C. Implementation of EUV radiation in lithography requires vacuum during exposure, which will mechanically distort any thin pellicle protective cover mounted on the mask.

D. Cleaning requirements of EUV masks are much more demanding than for DUV masks, requiring (1) special carriers for carrying the EUV masks, and (2) vacuum at all stages where the EUV masks are exposed to EUV. In other worlds a tolerable cleanliness level for an EUV mask (especially the upper side of the EUV mask) is much higher than the cleanliness level maintained in scanners of DUV inspection tools.

A standard EUV pod (compliant with SEMI standard E152-0709) includes an inner pod receiving the EUV mask, placed inside of an external pod. The inner pod is made out of a durable, opaque material that prevents DUV inspection of the EUV mask while the EUV mask is within the EUV pod. The outer carrier is suitable for transporting the EUV masks between various production stations.

The following publications relate to DUV/EUV lithography and DUV/EUV mask handling: U.S. Pat. Nos. 6,239,863; 6,364,595; 6,492,067; 6,646,720; 6,734,445; 6,906,783; 6,912,043; 7,042,554; 7,209,220; 7,304,720; 7,413,586; 7,453,549; 7,477,358.

Mask inspection, which is part of the production flow of manufacturing semiconductor devices, is also required to transit from inspection of DUV masks to EUV masks. Among other approaches, the implementation of commercially available mask inspection technologies, which are based on DUV 193 nm illumination, is researched.

Existing 193 nm mask inspection tools (such as Aera2™ commercially available from Applied Materials™ Inc.) have the optical capability and resolution to support EUV inspection. However, these tools were not designed to address the challenges of handling the new EUV masks, for example, supporting the much higher mask environmental cleanliness requirements associated with EUV masks.

SUMMARY OF THE INVENTION

According to an embodiment of the invention, there is provided a system for inspecting an EUV (Extreme Ultra Violet) mask with DUV (Deep Ultra Violet) illumination. The system may include: (a) a mask manipulator, that may be arranged to: (i) receive an EUV pod that encloses an EUV mask, the EUV pod including an inner pod that may be placed inside an outer pod; wherein the EUV pod may be substantially opaque to DUV radiation; (ii) extract, in a highly clean environment, the EUV mask from the outer pod and the inner pod; and (iii) cover, in the highly clean environment, an upper face of the EUV mask with a protective cover that may be at least partially transparent to DUV radiation; (b) a scanner, arranged scan the EUV mask, using the DUV illumination provided by an optical DUV illuminator, while maintaining in the scanner an environment that has a cleanliness level that may be below a tolerable EUV mask cleanliness level; and (c) a transport system arranged to transport the EUV mask and the protective cover between the scanner and the mask manipulator. The tolerable EUV mask cleanliness level does not exceed a cleanliness level of the highly clean environment.

The mask manipulator may be external to an inspection system that includes the scanner and the optical DUV illuminator. The mask manipulator may be arranged to enclose the EUV mask in a pod that includes the protective cover, wherein the pod maintains at least the tolerable EUV mask cleanliness level.

The mask manipulator may be arranged to remove the protective cover from the EUV mask and place the EUV mask in the EUV pod. The transport system may be arranged to move the EUV pod between the mask manipulator and a load port.

The mask manipulator may be arranged to attach the transparent protective element to the EUV mask while the EUV mask may be substantially vertical.

The mask manipulator may be arranged to enclose the EUV mask in a pod that includes the protective cover, an opening and a filter. The filter may be arranged to filter air that enters the opening. The opening may prevent the enclosure from hermetically sealing the EUV mask.

The mask manipulator may be arranged to enclose at least a lower face of the EUV mask with a low outgassing cover.

The mask manipulator may be configured to flip the inner pod prior to a removal of the EUV mask from the inner pod.

The protective cover may be a pellicle protective cover.

The EUV pod may be compliant with an EUV pod standard.

According to an embodiment of the invention, there may be provided a method for inspecting an extreme ultra violet (EUV) mask by a deep ultra violet (DUV) inspection system, the method including: receiving an extreme ultra violet (EUV) pod that encloses an EUV mask, the EUV pod includes an inner pod that may be placed inside an outer pod; wherein the EUV pod may be substantially opaque to deep ultra violet (DUV) radiation; extracting, in a highly clean environment, the EUV mask from the outer pod and the inner pod; and covering, in the highly clean environment, an upper face of the EUV mask with protective cover that may be at least partially transparent to DUV radiation thereby allowing the EUV mask to be scanned by DUV radiation while maintaining a cleanliness level that may be below a tolerable EUV mask cleanliness level; wherein the tolerable EUV mask cleanliness level does not exceed a cleanliness level of the highly clean environment.

The method may include inspecting the EUV mask by scanning the EUV mask, using the DUV illumination and collecting DUV radiation resulting from the scanning.

The method may include enclosing, within the highly clean environment, the EUV mask in a pod that includes the protective cover, wherein the pod maintains a highly clean environment.

The method may include removing, in the highly clean environment, the protective cover from the EUV mask; placing, in the highly clean environment, the EUV mask in the EUV pod; and moving the EUV pod to a load port.

The method may include attaching the transparent protective element to the EUV mask while the EUV mask may be substantially vertical.

The method may include enclosing the EUV mask in a pod that includes the protective cover, an opening and a filter; wherein the filter may be arranged to filter air that enters the opening and wherein the opening prevents the enclosure from hermetically sealing the EUV mask.

The method may include enclosing at least a lower face of the EUV mask with a low outgassing cover.

The method may include flipping the inner pod prior to a removal of the EUV mask from the inner pod.

The protective cover may be a pellicle protective cover.

The method may include receiving an EUV pod that may be compliant with an EUV pod standard.

BRIEF DESCRIPTION OF THE DRAWINGS

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

FIG. 9 illustrates a method according to an embodiment of the invention; and

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A tolerable EUV mask cleanliness level can be a minimal cleanliness level required for managing EUV masks. Such a tolerable EUV mask cleanliness level can be defined by international standards but this is not necessarily so. It is expected that this cleanliness level will be elevated as the frequency of the radiation increases. Today the tolerable EUV mask cleanliness level is expected to be 100 higher than the cleanliness level expected from DUV inspection tools.

Figure 1A:
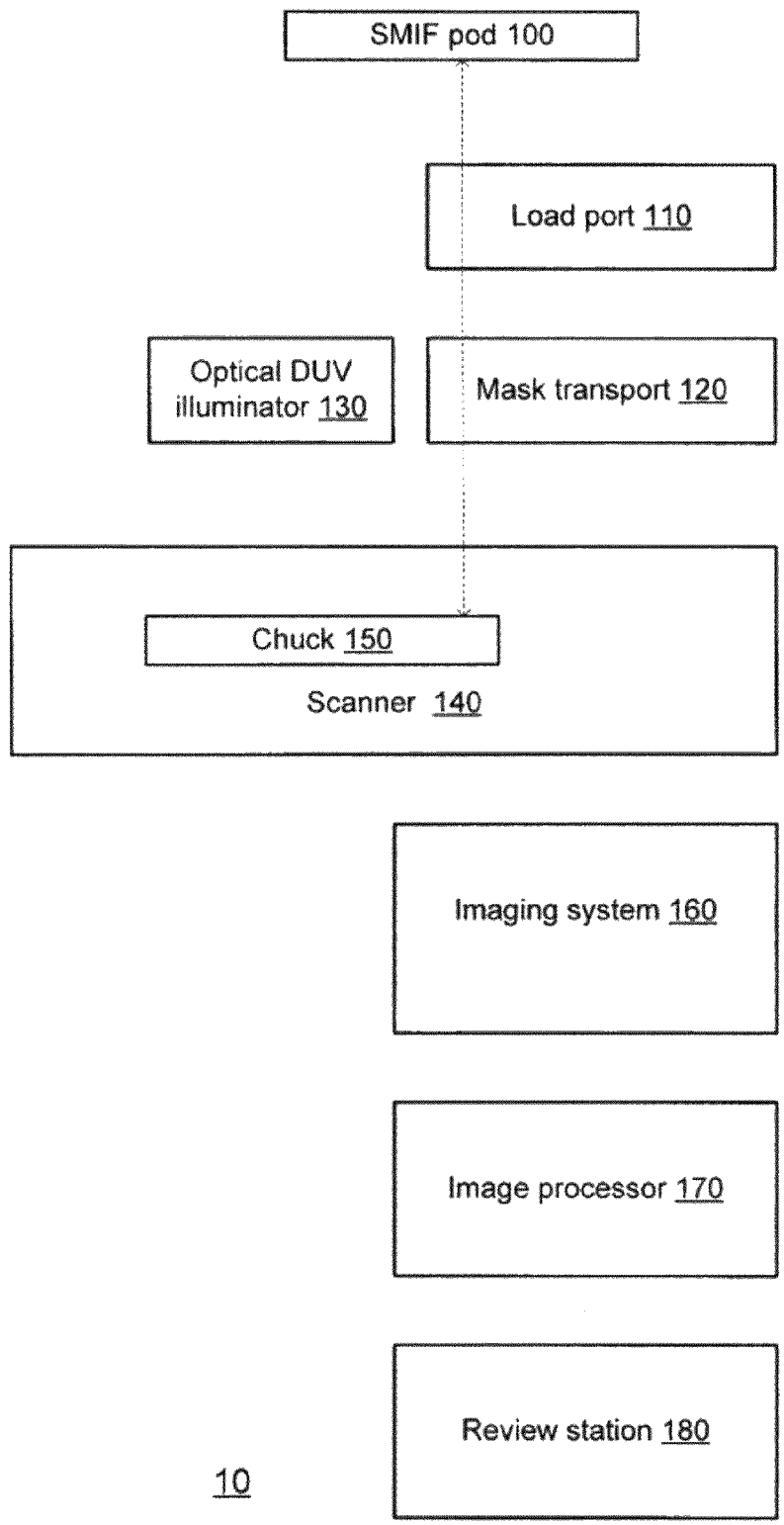
FIG. 1a illustrates a prior art DUV inspection tool.

FIG. 1A schematically illustrates a DUV mask inspection tool (tool) 10 (e.g., Aera2™ commercially available from Applied Materials™ Inc.).

Tool 10 includes the following main units:

A. Load port 110 for receiving an SMIF (Standard Mechanical Interface) pod 100;

B. Mask transport 120 (e.g., a robot) for placing the mask onto a chuck 150 inside of the scanner 140;

C. Scanner 140;

D. Optical DUV illuminator 130;

E. Imaging system 160;

F. Image processing unit 170; and

G. Review station 180.

The dashed vertical line illustrates the transfer of the SMIF pod 100 between units of system 10.

Figure 1B:
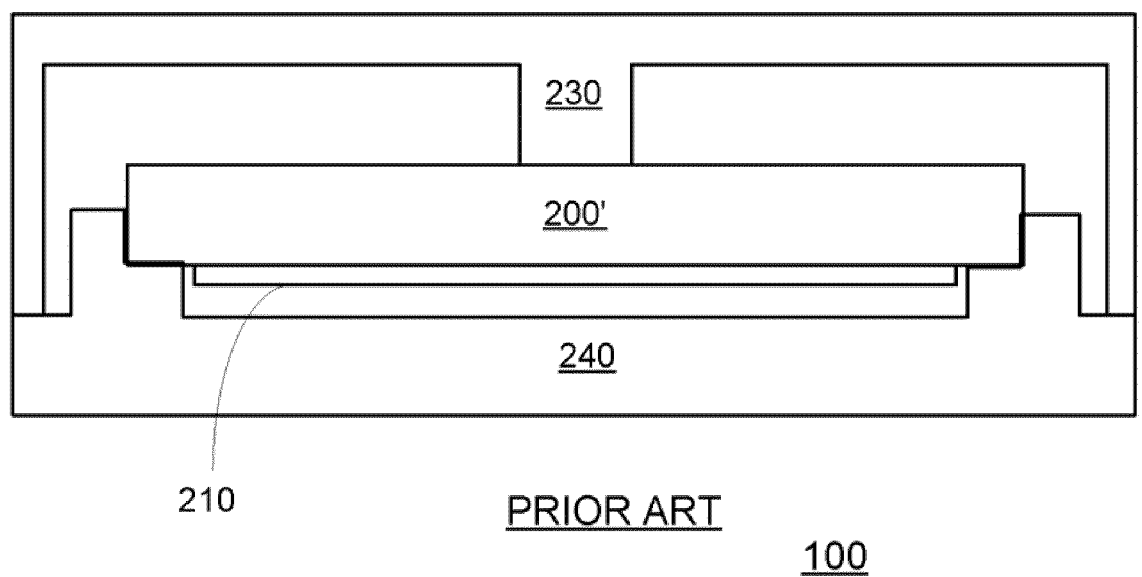
FIG. 1b illustrates a prior art DUV pod that encloses a DUV mask.

FIG. 1B illustrates a prior art DUV SMIF pod 100 which includes DUV mask 200' and its pellicle protective cover 210 built thereon. The DUV SMIF pod 100 has an upper cover 230 and lower cover 240. The DUV mask 200' is carried by the DUV SMIF pod 100 during transport. When carried in the DUV SMIF pod 100 the mask is turned upside down and FIG. 1b shows the pellicle protective cover 210 as being positioned below the DUV mask 200'. When inspected, the pellicle protective cover 210 and the upper side of the DUV mask 200' can be positioned in an upward position.

In operation, the load port 110 receives the DUV SMIF pod 100 and opens it. Robot 120 takes the DUV mask 200', turns it upside down and places it onto chuck 150.

The DUV mask 200' is scanned by scanner 140 using DUV illumination provided by optical DUV illuminator 130. The resultant DUV radiation is collected by imaging system 160 and analyzed by image processing system 170 to provide a defect map and images associated with suspected defect locations of the DUV mask 200'.

Note, 193nm masks are inspected by current tools (e.g., Aera2) either with or without pellicle (i.e., for 193nm masks, Aera2 cleanliness is qualified for handling and inspecting both pellicalized and unpellicalized masks).

Typically, the scanner 140 and illuminator 130 are designed to inspect DUV masks covered with pellicle as the working distance of the scanner 140 is designed to suit the height of the pellicle a certain distance from the face of the mask (typically 3 to 7 mm). Typically no vacuum is required to address cleanliness requirements; and the pellicle material is transparent and resistant to DUV illumination.

Figure 2:
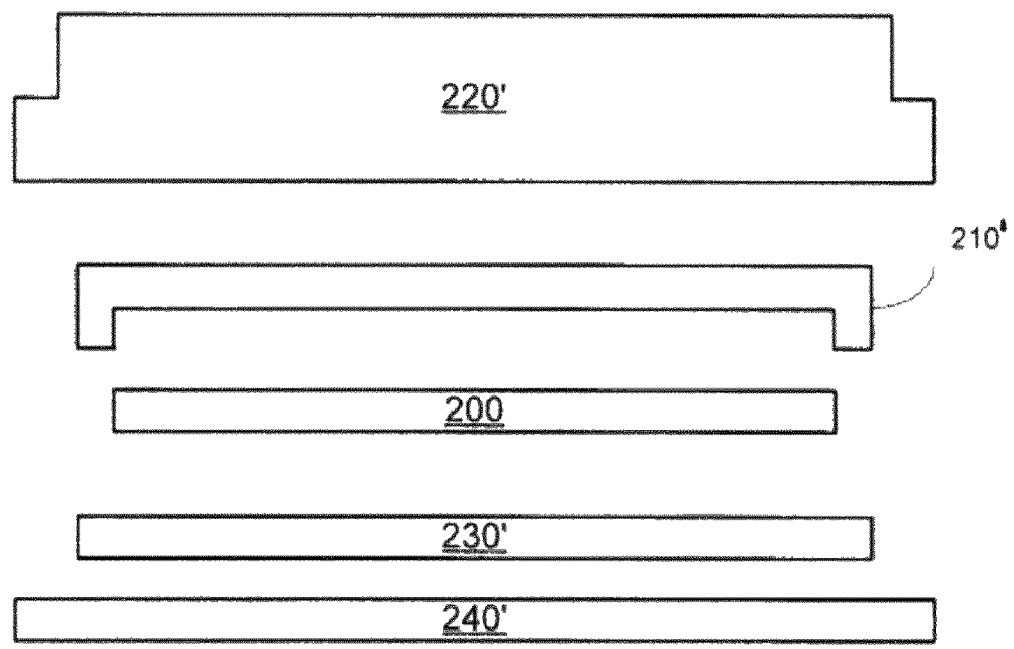
FIG. 2 illustrates a SEMI standard E152-0709 compliant EUV pod (EUV pod) and a mask.

FIG. 2 illustrates the structure of a prior art standard EUV pod (also known as carrier) 20, compliant with SEMI standard E152-0709.

EUV Pod 20 includes an inner pod that includes inner pod cover 210' and inner pod base plate 230' for receiving the EUV mask 200. The inner pod cover 210', and additionally or alternatively, the base plate 230' are made of a durable, opaque material.

The inner pod is placed inside of an outer pod including outer pod shell 220' and outer pod door 240'. The EUV pod 20 is suitable for transporting the EUV mask 200 between various production stations.

According to an embodiment of the invention, prior to inspection, the EUV mask 200 is taken out of the EUV pod 20 and is covered by a protective cover that may include (or may be) a pellicle. The protective cover may belong to a protective pod that may encapsulate the EUV mask 200 from one side or both sides so that the EUV mask 200 (or at least the upper side of the EUV mask) is protected by the protective pod (or at least the protective cover) during all DUV inspection stages.

For simplicity of explanation the following description will refer to a protective pod although the following description can be applied mutatis mutandis to a protective cover that covers the upper side of the EUV mask 200.

The exchange of pods may be performed in a highly clean environment before the EUV mask 200 is fed to a scanner of the mask inspection tool. The exchange of pods can be executed by a mask manipulator that is integrated with the inspection tool or be external to the inspection tool.

Apart from a short period of time of removal from the EUV pod 20 and encapsulation by the protective pod, the EUV mask 200 is always protected, either by the EUV pod 20 or by the protective pod, and therefore protected from contamination. Special environmental conditions (e.g., particle and chemical contamination free) are implemented only at specific units (e.g., units responsible for covering the mask with the protective cover) while the design of other systems and units of the mask inspection tool need not be modified. Specifically, the inspection of the EUV mask 200 is performed by the DUV scanner used for scanning DUV masks, so no major modifications are needed, and no vacuum conditions should be applied during inspection. By implementing either one of the illustrated systems and method, high quality and efficient DUV inspection of a EUV mask is provided, with short time to market and low cost, thereby addressing market needs.

Figure 3:
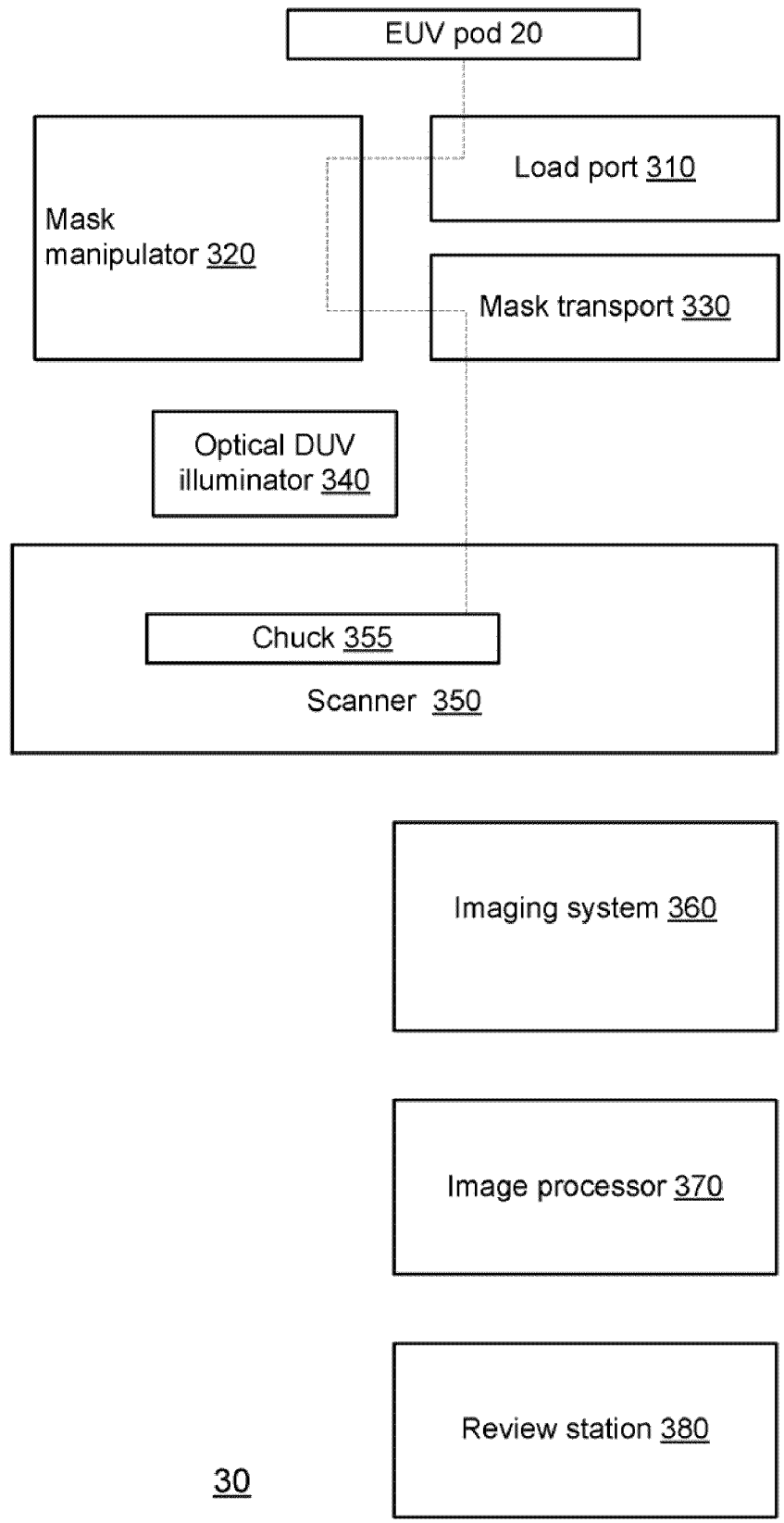
FIG. 3 schematically illustrates a system according to an embodiment of the invention, suitable for DUV scanning of EUV masks.

FIG. 3 schematically illustrates a system 30 according to an embodiment of the invention, suitable for DUV scanning of EUV masks. System 30 includes the following main units:

A. Load port 310 for receiving an EUV pod 20 (such as a standard pod or a non-standard pod) and for carrying the EUV pod 20 to a transport system (mask transport) 330;
B. A mask manipulator 320 for preparing the EUV mask 200 for inspection (as described above, the preparation of EUV mask 200 for inspection includes encapsulating the mask 200 in a protective pod (not shown in FIG. 3));
C. Transport system 330 (e.g., a robot) for transferring an protective pod that encapsulates the EUV mask between load port 310, mask manipulator 320 and a mask holder system (such as a chuck system) 355 inside of the scanner 350;
D. An illumination source such as optical DUV illuminator 340;
E. A detection unit such as imaging system 360;
F. A processing unit such as image processing unit 370; and
G. Review station 380.

It is noted that the system 300 may include less units, additional units or other units than those illustrated in FIG. 3. For example, the review station 380 can be regarded as an optional unit.

The dashed lines illustrate the transfer of the EUV pod 20 between units of system 30.

According to certain embodiments of the invention, the mask manipulator 320 includes a dedicated robot configured to perform the preparation operations illustrated in FIGS. 4A-4G. The robot can include one or more robotic arms having attachment and detachment capabilities for extracting the EUV mask 200 from the EUV pod 20 and for placing the EUV mask 200 in the protective pod 1100.

The EUV pod 20 is designed in a manner that facilitates its manipulation, its opening and the closing thereof. For example, the EUV pod 20 may be designed to include robotic handling flanges, latch-pin holes, pins, conveyor rails, end effector exclusion volumes, secondary and primary side robotic handling flanges, features for reticle alignment and data matrix identification, registration pin features, features which mate with kinematic-coupling pins, and the like. The protective pod 1100 can be designed to include at least some of these features or additional features. The EUV pod 20 is designed to be opened and closed during EUV lithography and the known opening and closing techniques of the EUV pod 20 can be applied by the mask manipulator.

According to another embodiment of the invention, the transport system 330 and the mask manipulator 320 can be integrated. It should be noted that units 310, 320 and 330, which are illustrated herein as separated systems, could be integrated together to form a single system, or to have common elements among them.

According to an embodiment of the invention, the main operations illustrated in FIGS. 4A-4G are carried out by various units of the inspection tool 30.

The load unit 310 receives an EUV pod 20 carrying the EUV mask 200. The load unit 310 can be a SMIF (Standard Mechanical Interface) load port but this is not necessarily so.

The transport system 330 can transport the EUV pod 20 to the mask manipulator 320.

Alternatively, the load port 310 extracts the inner pod from the outer pod and provides the inner pod to the mask manipulator 320. The mask manipulator extracts the EUV mask 200 and encloses the EUV mask 200 by the protective pod 1100.

The transport system 330 can provide the protective pod 1100 (with the EUV mask 200) to a chuck 355 of a scanner 350 to allow the scanning of the EUV mask 200 by DUV radiation provided by the optical DUV illuminator 340. The mask inspection process also includes utilizing other units such as imaging system 360 and image processing unit 370.

Once the scanning ends, the protective pod 1100 is provided, by the transport system 330, to the mask manipulator 320.

The mask manipulator 320 extracts the EUV mask 200 from the protective pod 1100 and places it in the EUV pod 20.

Alternatively, the mask manipulator 320 extracts the EUV mask 200 from the protective pod 1100, load port 310 extracts the inner pod from the outer pod and provides the inner pod to the mask manipulator 320. The mask manipulator extracts the EUV mask 200 from the protective pad 1100 and encloses the EUV mask 200 in the inner pod of the EUV pod 20. The load unit 310 receives the inner pod and encloses it in the outer pod to provide the EUV pod 20.

FIGS. 4A-4G illustrate an EUV mask and additional related components during various stages of a DUV inspection preparation sequence, according to an embodiment of the invention. It is assumed that the load port 310 separates between the inner pod and the outer pod of the EUV pod 20. It is noted that the mentioned below sequence can be applied by a mask manipulator 320 that extracts the EUV mask 200 from both the inner and outer pods of the EUV pod 20. It is further assumed that the EUV mask is protected against contamination by being attached to a protective cover 410. It is noted that the following explanation can be applied mutatis mutandis to an enclosure of the EUV mask 200 by a protective pod 1100 that encloses both sides of the EUV mask 200.

Figure 4A:
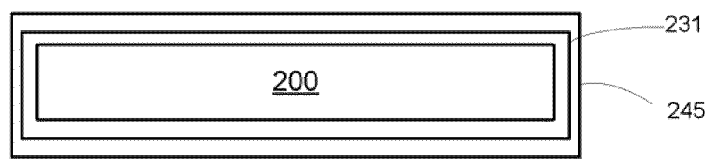
FIGS. 4A-4G illustrate an EUV mask and additional related components during various stages of a DUV inspection preparation sequence, according to an embodiment of the invention.

In FIG. 4A, an EUV pod 20 that encloses the EUV mask 200 is provided to the load port 310. The EUV pod 20 includes an inner pod 231 and an outer pod 245.

Figure 4B:
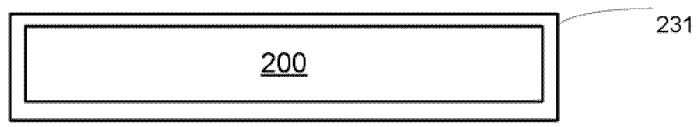

In FIG. 4B, the load port 310 opens the outer pod 245 by separating elements 220' and 240' of the outer pod 245. It provides the inner pod 231 with EUV mask 200 to the transport mechanism 330. The transport mechanism 330 can include an end-effector (of a robot) that receives the inner pod and the EUV mask 200 to mask manipulator 320. Alternatively, the end effector can take the inner pod 231 with EUV mask 200 from a standard pod opener.

Figure 4C:
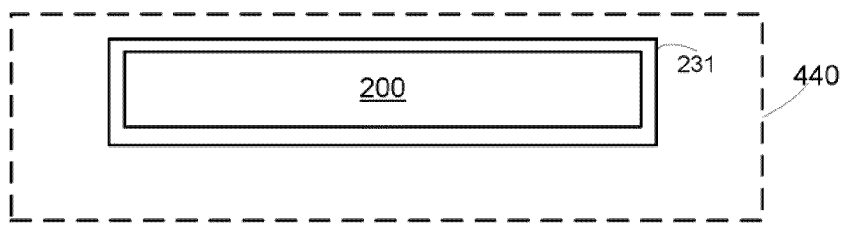

FIG. 4C illustrates a clean environment 440 in which the EUV mask 200 and the inner pod are located before extracting the EUV mask 200.

Figure 4D:
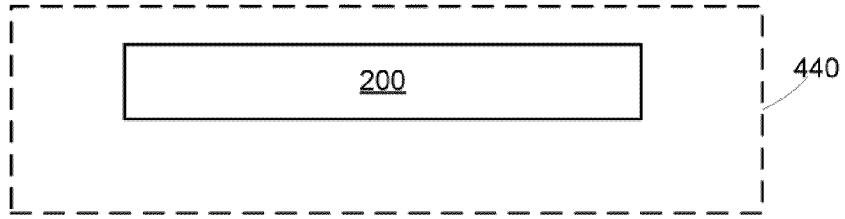

FIG. 4D illustrates the clean environment 440 after the mask manipulator 320 extracts the EUV mask 200 from inner pod 231.

Figure 4E:
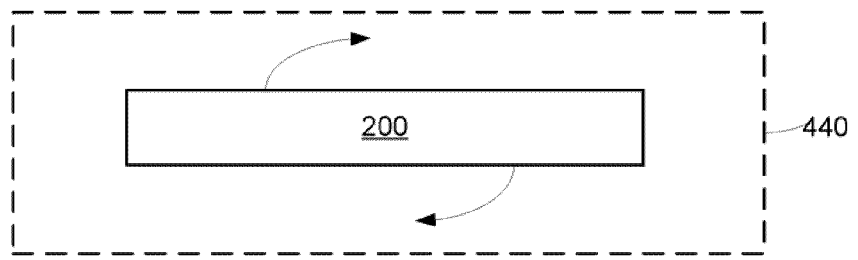

FIG. 4E illustrates that prior to (or after) the installation of the protective cover 410 (FIG. 4F), the mask manipulator 320 flips the EUV mask 200 (this operation is required in tools that scan the mask printed side up).

Alternatively, the mask manipulator 320 can flip the EUV mask 200 (or the inner pod or EUV pod 20) to a position that may reduce the contamination of the upper side of the EUV mask 200. Thus, the EUV mask 200 or the inner pod can be rotated to a vertical position before removing the inner pod or the EUV mask 200 and until a protective cover is attached to the EUV mask 200.

Figure 4F:
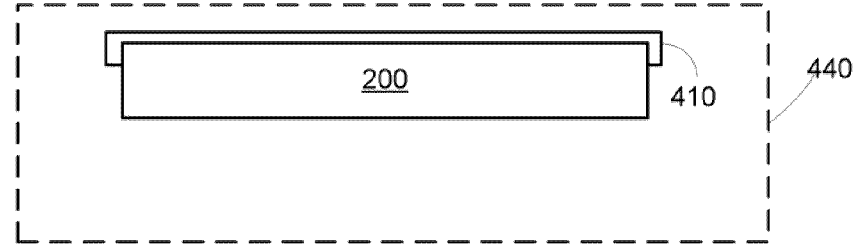

In FIG. 4F, the mask manipulator 320 attaches a protective cover 410 (such as pellicle cover), on top of the EUV mask 200. According to an embodiment of the invention (illustrated in FIG. 4F), the EUV mask 200 is fixed to a protective pellicle material. As illustrated, the installation of the protective pellicle material can be done while the EUV mask is oriented horizontally or in any other orientation.

According to another embodiment of the invention (not shown), the installation of the protective cover can be done in a vertical configuration, where both the EUV mask 200 and the protective cover 410 are vertically oriented such that contaminants on the pellicle will not fall onto the EUV mask 200 during engagement and disengagement of the protective cover 410.

According to yet another embodiment of the invention (not shown), the protective cover 410 is a part of (integrated with) protective pod 1100, which could be compatible in its outer faces with SMIF or it may have a non-standard design.

According to another embodiment, the protective pod 1100 includes two pellicle covers, one on each of its upper and lower faces, to facilitate backside inspection. According to one embodiment of the invention, the EUV mask 200 is fixed to or tightly held by the protective pod 1100.

According to another embodiment of the invention, the EUV mask 200 is placed inside of the protective pod 1100. A pellicle of the protective pod 1100 could be engaged to the EUV mask 200 on the patterned side, back side or edges. The invention is not limited by the manner of engagement of the pellicle to the EUV mask 200, and various alternatives are included within the scope of the invention.

Figure 4G:
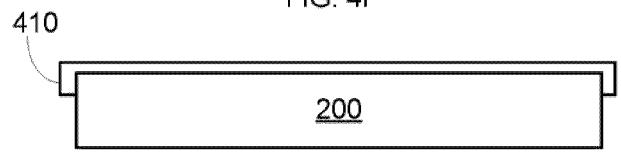

In FIG. 4G, the mask manipulator 320 returns the EUV mask 200 and its protective cover 410 to the end-effector of robot 330, to be transported for scanning.

When the scan is finished the EUV mask 200 will travel back through the system in an opposite sequence, i.e., through the system in a sequence described by operations shown in FIGS. 4G to 4A.

According to certain embodiments of the invention, the order of the operations illustrated in FIGS. 4A-4G may be different than described above. For example, the inner pod 231 may be flipped prior to its opening, either outside or inside the clean environment 440; the inner pod 231 may be flipped after the pod is opened or after the protecting pellicle cover 410 is placed onto the EUV mask 200. Common to all these embodiments is the removal of the EUV mask from the standard outer pod and inner pod and protecting it with a cover/pellicle protective for handling the mask inside of the inspection tool.

Figure 5:
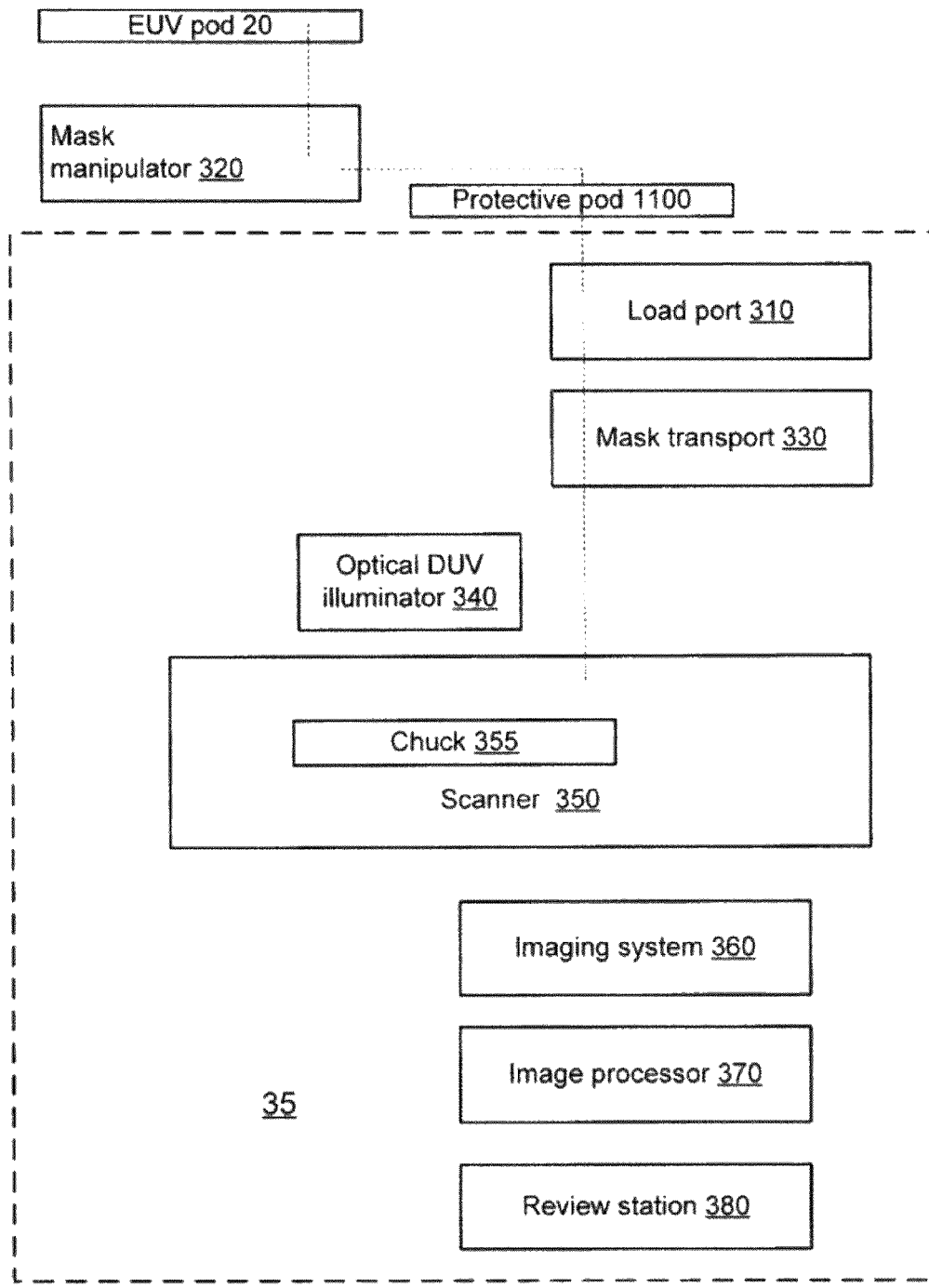
FIG. 5 schematically illustrates a system according to an embodiment of the invention, suitable for DUV scanning of EUV masks.

Another embodiment of the invention is illustrated in FIG. 5, where the same reference numbers are used for elements of the system illustrated in FIG. 3. The mask manipulator 320 is not a part of the inspection tool (as illustrated in FIG. 3) but is external to the inspection tool 35.

FIG. 5 illustrates the mask manipulator 320 as being included in an external pod exchanger unit associated with a DUV mask inspection tool 35, which could be any commercially available DUV mask inspection tool. In such a configuration the mask manipulator 320 extracts the EUV mask 200 from the EUV pod and places the EUV mask in the protective pod 1100.

According to an embodiment of the invention (not shown), a single mask manipulator 320 may also be connected to other tools as well, such as a DUV mask defect review tool, EUV mask particles scanner or any other system that includes any sort of mask handling.

Figure 6A:
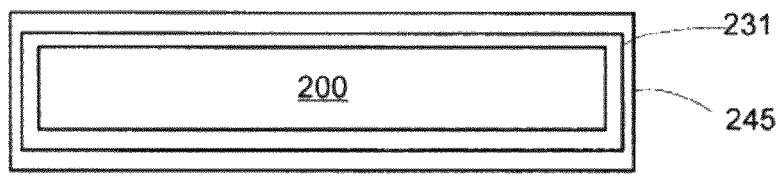
FIGS. 6A-6F illustrate an EUV mask and additional related components during various stages of a DUV inspection preparation sequence, according to an embodiment of the invention.
Figure 6B:
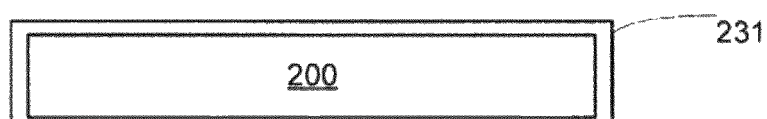
Figure 6C:
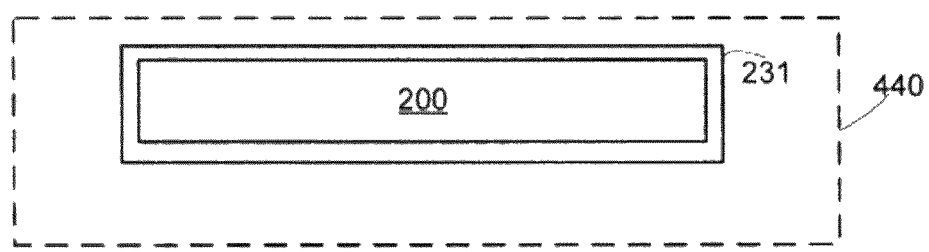
Figure 6D:
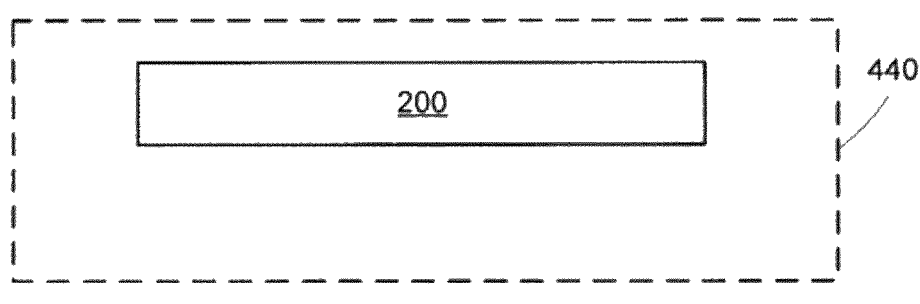
Figure 6E:
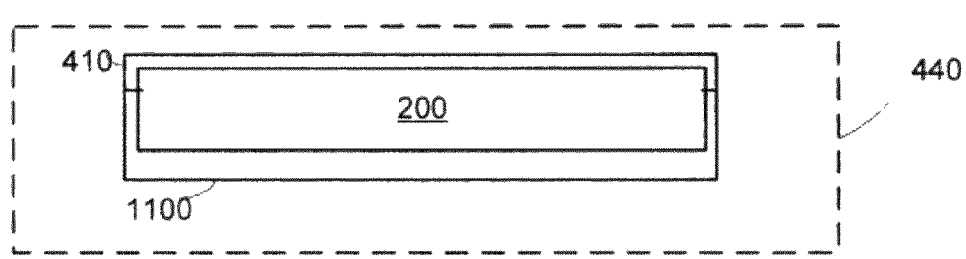
Figure 6F:
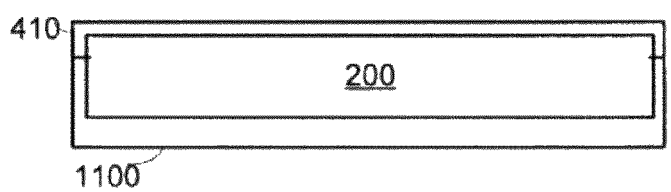

In operation, as illustrated in FIGS. 6A-6F in a self explanatory manner, external mask manipulator 320 receives the EUV mask 200 that is placed within a standard EUV pod 20 (FIG. 6A). The EUV mask 200 is separated from the standard EUV pod 20 by removing the outer pod 245 (FIG. 6B), placing it in the highly clean environment 440 (FIG. 6C) and then removing (within the highly clean environment 440) the inner pod (FIG. 6D) and placing the EUV mask 200 in the protective pod 410 (FIG. 6E) which may be compatible with SMIF. The protective pod 1100 can be loaded into mask inspection tool 35.

It is noted that the protective cover 410 can be a part of the protective pod 1100.

The dashed vertical lines illustrate the transfer of the EUV pod 20 between units of system 35.

The EUV mask 200 need not be flipped by the external mask manipulator 320. The transportation of the protective pod 1100 to the mask inspection tool 35 could be a manual or an automated operation.

According to this embodiment of the invention, no alterations and modifications are required in the hardware of inspection tool 35 in order for it to accommodate EUV masks (except for addressing stricter cleanliness requirements, if such would be needed, e.g., improved filters).

Further, protective pod 1100 could be loaded to any available MI tools. After scanning or whenever required, the protective pod 1100 is loaded into the external mask manipulator 320 and a reverse sequence of operations 6F-6A is performed in order to return the EUV mask 200 to its standard EUV pod 20.

In order to simplify the explanations, the present invention was described with reference to handling a single EUV mask.

As known in the semiconductor processing arts, masks are handled in stocks (by the so-called stocker). According to the embodiment of the invention relating to the integration of the manipulator with the inspection tool, the stocker is designed to hold the EUV masks and their respective protective pellicle cover. According to another embodiment of the invention, the stand-alone manipulator, the stocker is configured to hold the inner pods carrying the EUV masks.

According to an embodiment of the invention, the protective cover 410 may be placed about a few millimeters above the upper side (or bottom side) of the EUV mask 200 (e.g., less than 7mm), similar to the standard design of DUV masks, so as to enable scanning of the EUV mask 200 at the same working distance of DUV masks scanning.

According to an embodiment of the invention, a protective cover 410 is included in a protective pod 1100 that encapsulates the upper side and the lower side of the EUV mask 200. Preferably, the protective cover 410 is made of DUV transparent material (for example pellicle material) and the other side of the protective pod 1100 is made of a different material, such as Aluminum or any other material meeting the required cleanliness requirements (e.g., no outgassing)—the tolerable EUV mask cleanliness level.

According to an embodiment of the invention, the protective pod 1100 (of FIGS. 10 and 11) is not hermetically sealed in order to avoid contact between the EUV mask 200 and the protective pod 1100 (especially the pellicle —if such exists) due to an external over pressure. Instead the inner volume of the protective pod 1100 is allowed to equalize the inner and outer pressure through special filters, thus reducing volatile contamination of the mask. According to other embodiments, and as illustrated in FIG. 11, openings are introduced into the protective pod 1100, and suitable filters are placed over the openings to prevent contamination of chemicals and/or particles.

According to an embodiment of the invention, the protective cover 410 is integrated with the inner pod of the EUV pod 20. According to an embodiment of the invention, non-standard protective pod designs are used and appropriate modifications and alterations are introduced into the design of various units and components of the inspection tool without departing from the scope of the present invention.

Figure 7:
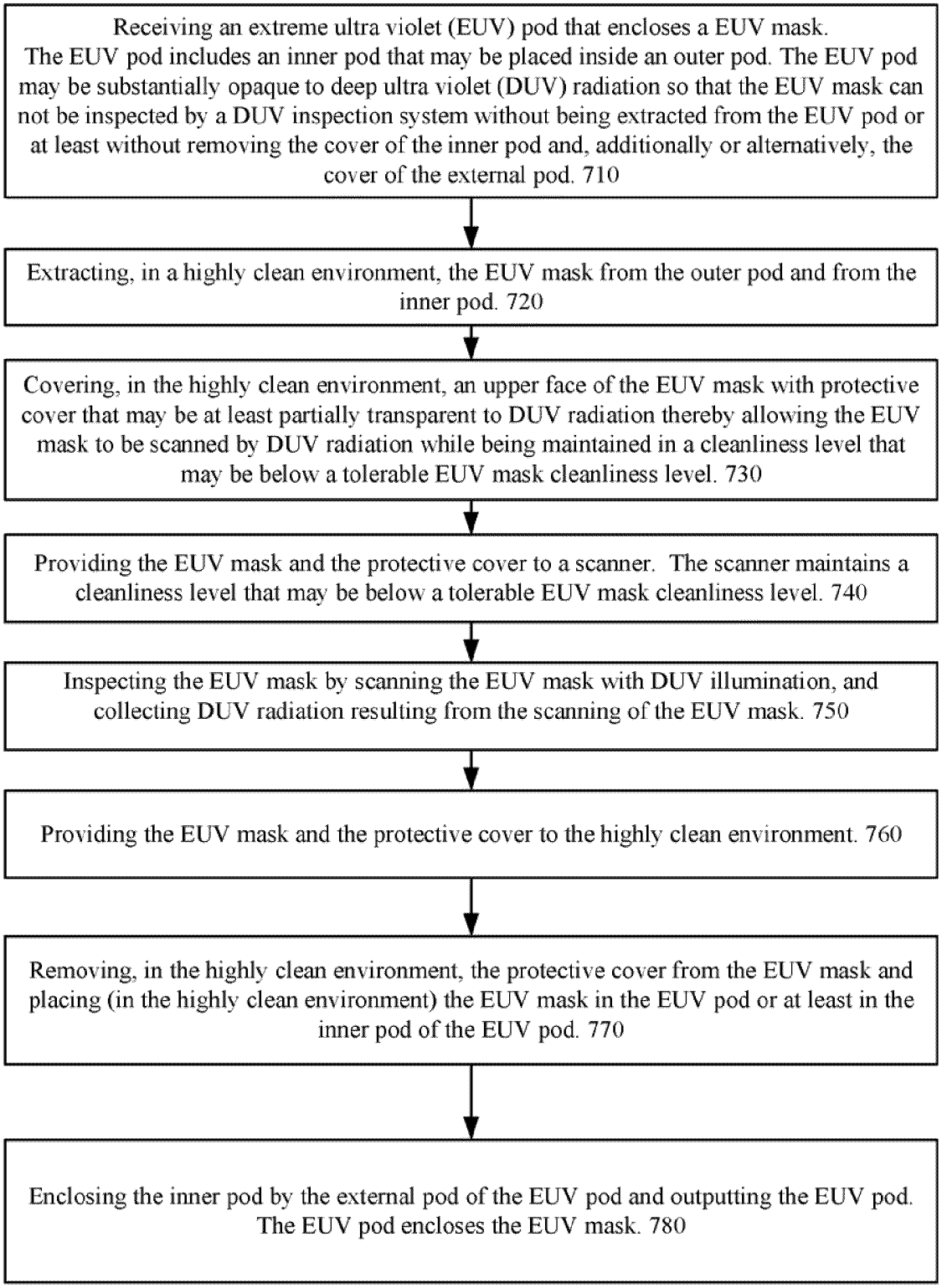
FIG. 7 illustrates a method according to an embodiment of the invention.

FIG. 7 illustrates method 700 according to an embodiment of the invention.

Method 700 allows an inspection of an extreme ultra violet (EUV) mask by a deep ultra violet (DUV) inspection system.

Method 700 starts by stage 710 of receiving an extreme ultra violet (EUV) pod that encloses an EUV mask.

The EUV pod includes an inner pod that may be placed inside an outer pod. The EUV pod may be substantially opaque to deep ultra violet (DUV) radiation so that the EUV mask can not be inspected by a DUV inspection system without being extracted from the EUV pod or at least without removing the cover of the inner pod and, additionally or alternatively, the cover of the external pod.

The EUV pod can be a standard EUV pod that is compliant with an EUV pod standard such as but not limited to the SEMI standard E152-0709.

Stage 710 can include receiving the EUV pod by a standard manufacturing interface (SMIF) and providing it, by a transport system, to a mask manipulator that may include a robot.

Stage 710 may include receiving the EUV pod by a port load of an inspection system and providing it to a mask manipulator that maintains the highly clean environment. Alternatively, stage 710 may include receiving the EUV pod by a mask manipulator that is external to an inspection system.

Stage 710 is followed by stage 720 of extracting, in a highly clean environment, the EUV mask from the outer pod and from the inner pod.

The highly clean environment is highly clean in the sense that its cleanliness level is at least the tolerable EUV mask cleanliness level.

Stage 720 is followed by stage 730 of covering, in the highly clean environment, an upper face of the EUV mask with a protective cover that may be at least partially transparent to DUV radiation thereby allowing the EUV mask to be scanned by DUV radiation while being maintained in a cleanliness level that may be below a tolerable EUV mask cleanliness level.

Stage 730 can include at least one of the following stages: (i) enclosing, within the highly clean environment, the EUV mask in a protective pod that includes the protective cover, wherein the protective pod maintains a highly clean environment; (ii) attaching the transparent protective element to the EUV mask while the EUV mask may be substantially vertical (or otherwise tilted in relation to the horizon); (iii) enclosing the EUV mask in a protective pod that includes the protective cover, an opening and a filter; wherein the filter may be arranged to filter air that enters the opening and wherein the opening prevents the enclosure from hermetically sealing the EUV mask; (iv) enclosing at least a lower face of the EUV mask with a low outgassing cover.

Stage 730 is followed by stage 740 of providing the EUV mask and the protective cover to a scanner. The scanner maintains a cleanliness level that may be below a tolerable EUV mask cleanliness level.

Stage 740 is followed by stage 750 of inspecting the EUV mask by scanning the EUV mask with DUV illumination, and collecting DUV radiation resulting from the scanning of the EUV mask.

Stage 750 can include generating detection signals in response to the collected DUV radiation, processing the detection signals and applying any known error detection analysis or metrology analysis known in the art.

Stage 750 can also include performing a review or a verification process that may include analyzing selected areas of the EUV mask, especially areas that may include suspected defects.

Stage 750 is followed by stage 760 of providing the EUV mask and the protective cover to the highly clean environment.

Stage 760 is followed by stage 770 of removing, in the highly clean environment, the protective cover from the EUV mask and placing (in the highly clean environment) the EUV mask in the EUV pod or at least in the inner pod of the EUV pod.

Stage 770 may include at least one of the following: (i) outputting the EUV pod from the highly clean environment; (ii) moving the EUV pod to a load port, (iii) outputting the EUV from the load port.

Stage 770 may be followed (in case the external pod of the EUV pod was removed before being provide to the mask manipulator) by stage 780 of enclosing the inner pod by the external pod of the EUV pod and outputting the EUV pod. The EUV pod encloses the EUV mask.

Figure 8:
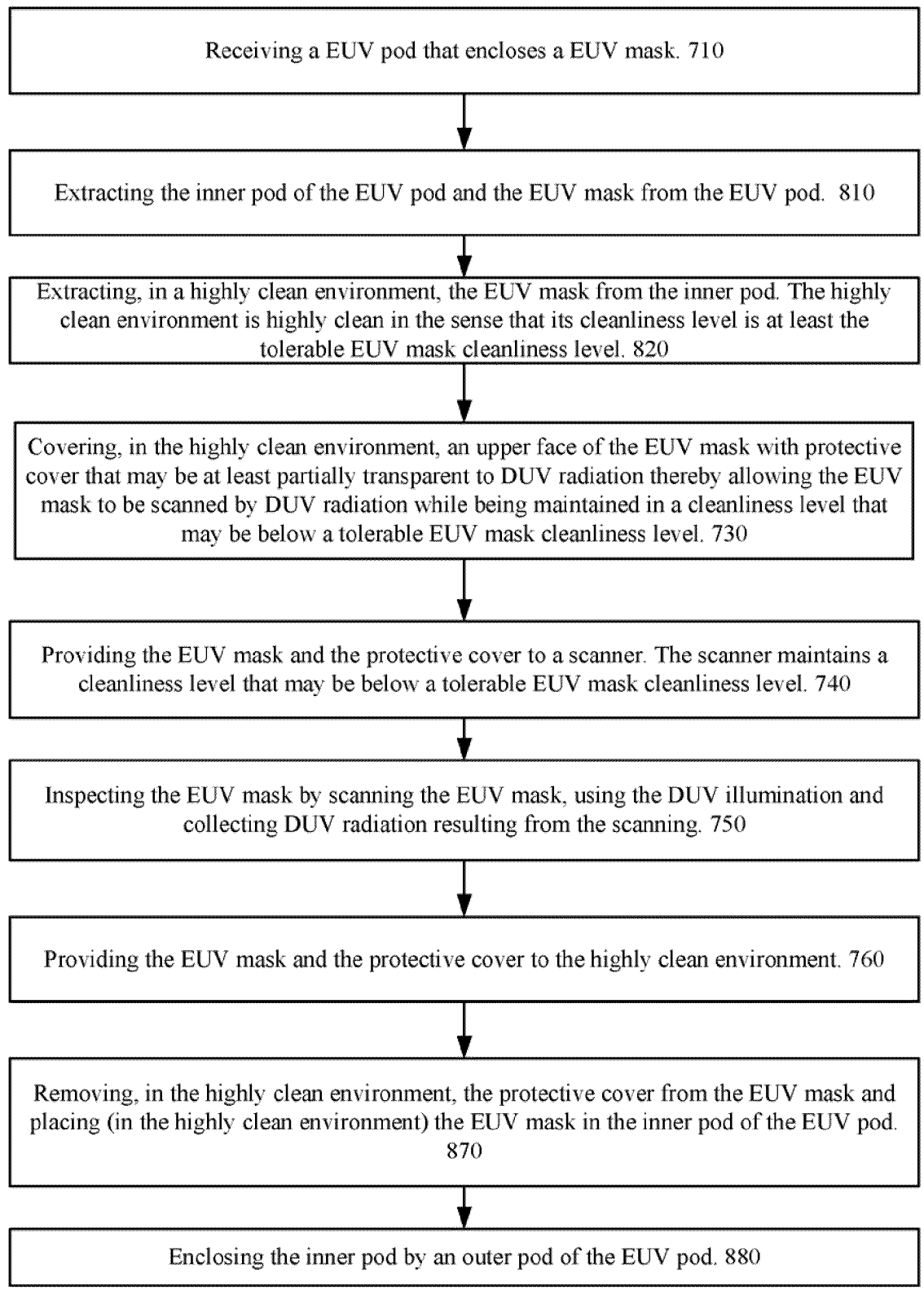
FIG. 8 illustrates a method according to an embodiment of the invention.

FIG. 8 illustrates method 800 according to an embodiment of the invention.

Method 800 allows an inspection of an extreme ultra violet (EUV) mask by a deep ultra violet (DUV) inspection system.

Method 800 starts by stage 710 of receiving a EUV pod that encloses an EUV mask.

The EUV pod can be a standard EUV pod that is compliant with an EUV pod standard such as but not limited to the SEMI standard E152-0709.

Stage 710 is followed by stage 810 of extracting the inner pod of the EUV pod and the EUV mask from the EUV pod. Stage 810 can be executed by a load unit that is arranged to provide the inner pod (enclosing the EUV mask) to a mask manipulator.

Stage 810 is followed by stage 820 of extracting, in a highly clean environment, the EUV mask from the inner pod. The highly clean environment is highly clean in the sense that its cleanliness level is at least the tolerable EUV mask cleanliness level.

Stage 820 is followed by stage 730 of covering, in the highly clean environment, an upper face of the EUV mask with a protective cover that may be at least partially transparent to DUV radiation thereby allowing the EUV mask to be scanned by DUV radiation while being maintained in a cleanliness level that may be below a tolerable EUV mask cleanliness level.

Stage 730 may include placing the EUV mask in a protective pod that includes the protective cover.

Stage 730 is followed by stage 740 of providing the EUV mask and the protective cover to a scanner. The scanner maintains a cleanliness level that may be below a tolerable EUV mask cleanliness level.

Stage 740 is followed by stage 750 of inspecting the EUV mask by scanning the EUV mask, using the DUV illumination and collecting DUV radiation resulting from the scanning.

Stage 750 is followed by stage 760 of providing the EUV mask and the protective cover to the highly clean environment.

Stage 760 is followed by stage 870 of removing, in the highly clean environment, the protective cover from the EUV mask and placing (in the highly clean environment) the EUV mask in the inner pod of the EUV pod.

Stage 870 is followed by stage 880 of enclosing the inner pod by an outer pod of the EUV pod.

FIG. 9 illustrates method 900 according to an embodiment of the invention.

Method 900 allows an inspection of an EUV mask by a DUV inspection system.

Method 900 starts by stage 910 of receiving, by an external pod manipulator, an EUV pod that encloses an EUV mask. The EUV pod includes an inner pod that may be placed inside an outer pod. The EUV pod may be substantially opaque to DUV radiation so that the EUV mask can not be inspected by a DUV inspection system without extracting it from the EUV pod or at least removing the cover of the inner pod and, additionally or alternatively, the cover of the external pod.

The EUV pod can be a standard EUV pod that is compliant with an EUV pod standard such as but not limited to the SEMI standard E152-0709.

Stage 910 is followed by stage 920 of extracting, in a highly clean environment, the EUV mask from the outer pod and the inner pod.

Stage 920 is followed by stage 930 of enclosing, in the highly clean environment, the EUV mask by a protective pod that may be at least partially transparent to DUV radiation thereby allowing the EUV mask to be scanned by DUV radiation while being maintained in a cleanliness level that may be below a tolerable EUV mask cleanliness level.

Stage 930 can include at least one of the following stages: (i) enclosing, within the highly clean environment, the EUV mask in a protective pod that maintains a highly clean environment; (ii) enclosing the EUV mask in the protective mask while the EUV mask may be substantially vertical (or otherwise tilted in relation to the horizon); (iii) enclosing the EUV mask in the protective pod that includes the protective cover, an opening and a filter; wherein the filter may be arranged to filter air that enters the opening and wherein the opening prevents the enclosure from hermetically sealing the EUV mask; (iv) enclosing the EUV mask in a protective pod that has a lower face made of an opaque but low outgassing cover.

Stage 930 is followed by stage 940 of providing the EUV mask and the protective pod to an inspection tool.

Stage 940 is followed by stage 950 of receiving the protective pod by a mask inspection tool and providing the protective pod to a scanner of the inspection tool.

Stage 950 is followed by stage 750 of inspecting the EUV mask by scanning the EUV mask, using the DUV illumination and collecting DUV radiation resulting from the scanning. Stage 750 can include generating detection signals in response to the collected DUV radiation, processing the detection signals and applying any known error detection analysis or metrology analysis known in the art. Stage 750 can also include performing a review or verification process that may include analyzing selected areas of the EUV mask, especially areas that may include suspected defects.

Stage 750 is followed by stage 960 of providing the EUV mask and the protective pod to the external pod manipulator.

Stage 960 is followed by stage 970 of removing, in the highly clean environment, the protective pod from the EUV mask and placing (in the highly clean environment) the EUV mask in the EUV pod.

Methods 700 and 800 can be executed by the system of FIG. 3 while method 900 can be executed by the system of FIG. 5.

Figure 10:
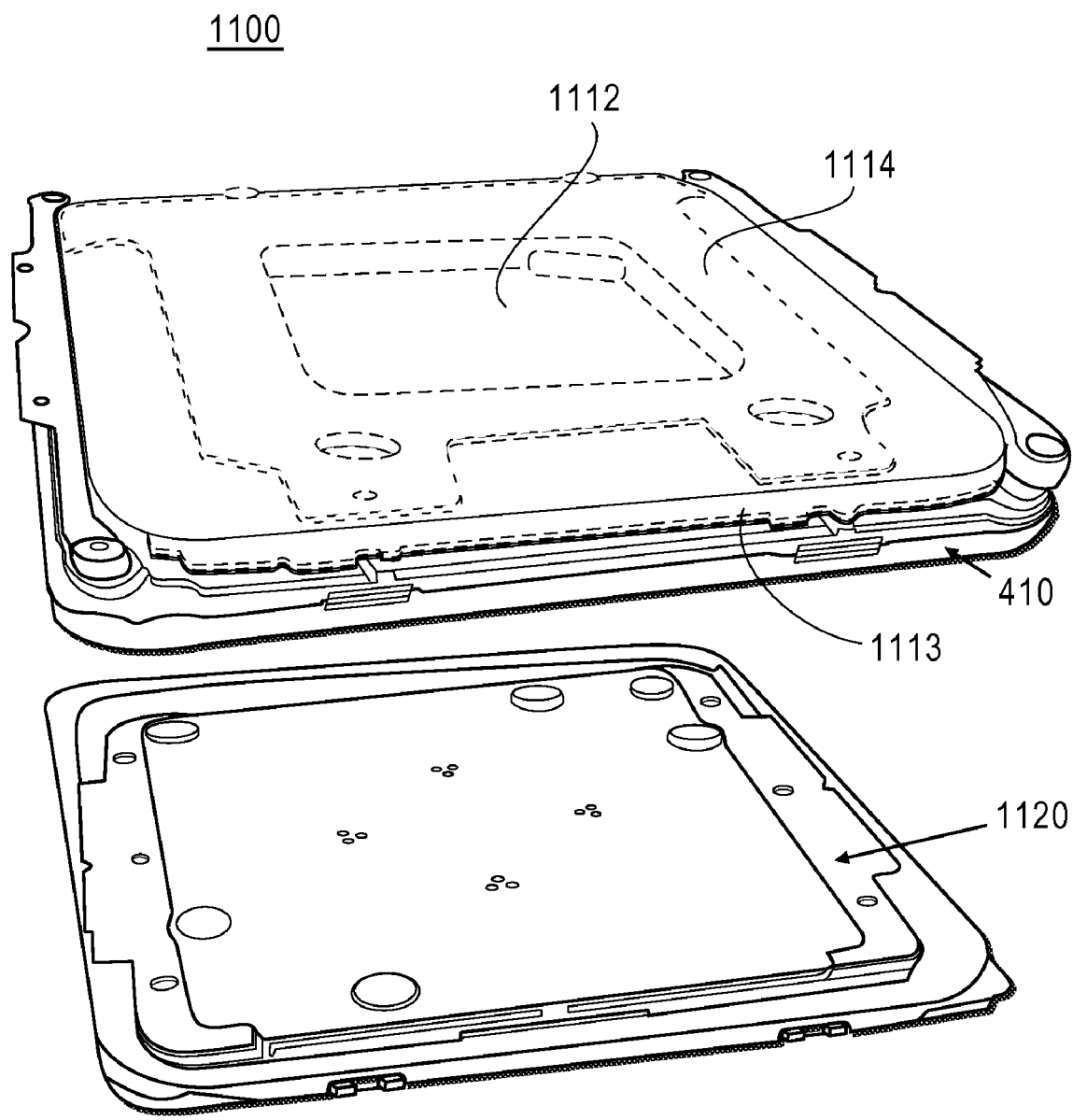
FIGS. 10 and 11 illustrate a protective pod according to an embodiment of the invention.
Figure 11:
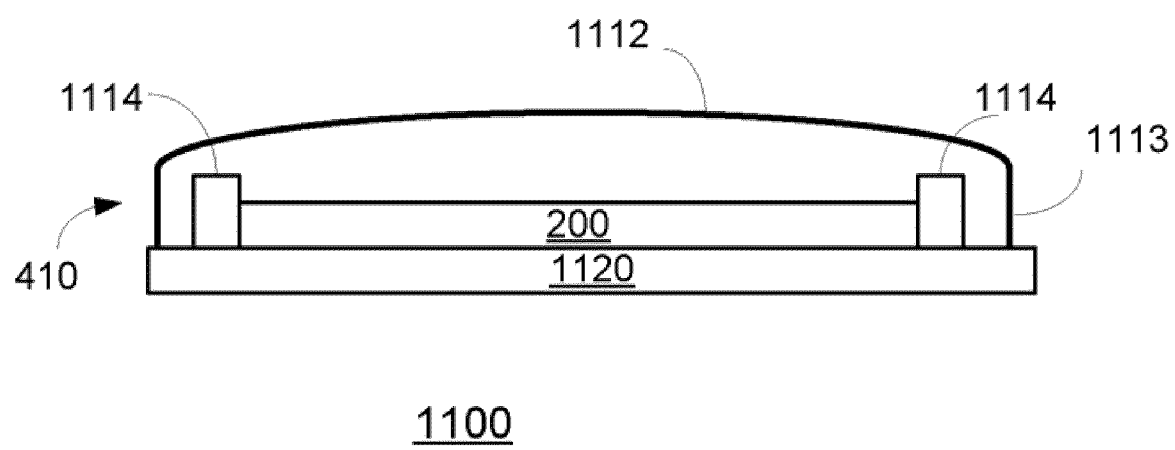

FIGS. 10 and 11 illustrate a protective pod 1100 according to an embodiment of the invention.

FIGS. 10 and 11 illustrate the protective pod 1100 as including a protective cover 410 that includes an upper transparent upper part such as a transparent dome 1112, and sidewalls 1113. The protective pod 1100 also has a lower part 1120.

The protective cover 410 and, additionally or alternatively, the lower part 1120 (base) can include structural elements 1114 that surround the EUV mask 200. In FIG. 10, the structural elements 1114 can be viewed through the transparent dome 1112 as defining a rectangular space in which the EUV mask 200 should be positioned.

The lower portion 1120 is illustrated in FIG. 10 as being made from a non-transparent material.

While certain features of the invention have been illustrated and described herein, many modifications, substitutions, changes, and equivalents will now occur to those of ordinary skill in the art. It is, therefore, to be understood that the appended claims are intended to cover all such modifications and changes that fall within the true spirit of the invention.

In the claims, the word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second"

are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A system, comprising:
   a mask manipulator arranged to:
   receive an extreme ultra violet (EUV) pod that encloses an EUV mask, the EUV pod comprising an inner pod that is placed inside an outer pod, wherein the EUV pod is opaque to deep ultra violet (DUV) radiation;
   extract, in a highly clean environment, the EUV mask from the outer pod and the inner pod; and
   cover, in the highly clean environment, an upper face of the EUV mask with a protective cover that is at least partially transparent to DUV radiation;
   a scanner arranged to scan the EUV mask using DUV illumination provided by an optical DUV illuminator, while maintaining in the scanner an environment that has a cleanliness level that is below a tolerable EUV mask cleanliness level; and
   a transport system arranged to transport the EUV mask and the protective cover between the scanner and the mask manipulator,
   wherein the tolerable EUV mask cleanliness level does not exceed a cleanliness level of the highly clean environment.

2. The system according to claim 1, wherein the mask manipulator is external to an inspection system that comprises the scanner and the optical DUV illuminator, wherein the mask manipulator is further arranged to enclose the EUV mask in a pod that comprises the protective cover, wherein the pod maintains at least the tolerable EUV mask cleanliness level.

3. The system according to claim 1, wherein the mask manipulator is further arranged to remove the protective cover from the EUV mask and place the EUV mask in the EUV pod, and wherein the transport system is further arranged to move the EUV pod between the mask manipulator and a load port.

4. The system according to claim 1, wherein the mask manipulator is further arranged to attach the protective cover to the EUV mask while the EUV mask is substantially vertical.

5. The system according to claim 1, wherein the mask manipulator is further adapted to enclose the EUV mask in a pod that comprises the protective cover, an opening and a filter, wherein the filter is arranged to filter air that enters the opening and wherein the opening prevents the pod from hermetically sealing the EUV mask.

6. The system according to claim 1, wherein the mask manipulator is further adapted to enclose at least a lower face of the EUV mask with a low outgassing cover.

7. The system according to claim 1, wherein the mask manipulator is configured to flip the inner pod prior to a removal of the EUV mask from the inner pod.

8. The system according to claim 1, wherein the protective cover is a pellicle protective cover.

9. The system according to claim 1, wherein the EUV pod is compliant with an EUV pod standard.

10. A method for inspecting an extreme ultra violet (EUV) mask by a deep ultra violet (DUV) inspection system, the method comprising:
    receiving an EUV pod that encloses the EUV mask, the EUV pod comprising an inner pod that is placed inside an outer pod, wherein the EUV pod is opaque to deep ultra violet (DUV) radiation;
    extracting, in a highly clean environment, the EUV mask from the outer pod and the inner pod; and
    covering, in the highly clean environment, an upper face of the EUV mask with a protective cover that is at least partially transparent to DUV radiation thereby allowing the EUV mask to be scanned by DUV radiation while maintaining a cleanliness level that is below a tolerable EUV mask cleanliness level,
    wherein the tolerable EUV mask cleanliness level does not exceed a cleanliness level of the highly clean environment.

11. The method according to claim 10, further comprising inspecting the EUV mask by scanning the EUV mask using DUV illumination and collecting DUV radiation resulting from the scanning.

12. The method according to claim 10, further comprising enclosing, within the highly clean environment, the EUV mask in a pod that comprises the protective cover, wherein the pod maintains a highly clean environment.

13. The method according to claim 10, further comprising removing, in the highly clean environment, the protective cover from the EUV mask; placing, in the highly clean environment, the EUV mask in the EUV pod; and moving the EUV pod to a load port.

14. The method according to claim 10, further comprising attaching the protective cover to the EUV mask while the EUV mask is substantially vertical.

15. The method according to claim 10, further comprising enclosing the EUV mask in a pod that comprises the protective cover, an opening and a filter, wherein the filter is arranged to filter air that enters the opening and wherein the opening prevents the pod from hermetically sealing the EUV mask.

16. The method according to claim 10, further comprising enclosing at least a lower face of the EUV mask with a low outgassing cover.

17. The method according to claim 10, further comprising flipping the inner pod prior to a removal of the EUV mask from the inner pod.

18. The method according to claim 10, wherein the protective cover is a pellicle protective cover.

19. The method according to claim 10, wherein the EUV pod is compliant with an EUV pod standard.

* * * * *